United States Patent
Zhang et al.

(10) Patent No.: US 12,012,014 B2
(45) Date of Patent: Jun. 18, 2024

(54) METHOD AND APPARATUS FOR OPTIMIZING BATTERY MANAGEMENT SYSTEM

(71) Applicant: Guangzhou Automobile Group Co., Ltd., Guangdong (CN)

(72) Inventors: Jiucai Zhang, Sunnyvale, CA (US); Jun Wang, Guangdong (CN); Chao Liu, Guangdong (CN); Jin Shang, Sunnyvale, CA (US); Qiang Ren, Guangdong (CN); Ao Mei, Guangdong (CN); Dadiao Ning, Guangdong (CN); Sichao Guo, Guangdong (CN); Sheng Hui, Guangdong (CN)

(73) Assignee: GUANGZHOU AUTOMOBILE GROUP CO., LTD., Guangzhou (CN)

( * ) Notice: Subject to any disclaimer, the term of this patent is extended or adjusted under 35 U.S.C. 154(b) by 784 days.

(21) Appl. No.: 17/172,106

(22) Filed: Feb. 10, 2021

(65) Prior Publication Data
US 2022/0250505 A1    Aug. 11, 2022

(51) Int. Cl.
| | | |
|---|---|---|
| *B60L 58/16* | (2019.01) | |
| *G01R 31/367* | (2019.01) | |
| *G01R 31/371* | (2019.01) | |
| *G01R 31/392* | (2019.01) | |

(52) U.S. Cl.
CPC ............ *B60L 58/16* (2019.02); *G01R 31/367* (2019.01); *G01R 31/371* (2019.01); *G01R 31/392* (2019.01); *B60L 2240/72* (2013.01)

(58) Field of Classification Search
CPC .. B60L 58/16; B60L 2240/72; B60L 2260/46; B60L 3/12; B60L 58/10; G01R 31/367; G01R 31/371; G01R 31/392
See application file for complete search history.

(56) References Cited

U.S. PATENT DOCUMENTS

| | | | |
|---|---|---|---|
| 11,609,273 B2 * | 3/2023 | Zhang | ............... B60L 3/12 |
| 2020/0101850 A1 * | 4/2020 | Harty | ............... B60L 55/00 |
| 2021/0005027 A1 * | 1/2021 | Handiaz | ............... G06N 20/00 |
| 2021/0380013 A1 * | 12/2021 | Moszynski | ........... B60L 53/66 |
| 2022/0250505 A1 * | 8/2022 | Zhang | ............ G01R 31/371 |
| 2022/0305945 A1 * | 9/2022 | Dooley | ............. G06Q 20/3829 |

* cited by examiner

*Primary Examiner* — Richard M Camby
(74) *Attorney, Agent, or Firm* — ScienBiziP, P.C.

(57) ABSTRACT

A method and apparatus for optimizing a battery management system (BMS) are provided. The method includes: obtaining training data, wherein the training data comprises data from a target vehicle and data from auxiliary vehicles, and the auxiliary vehicles are vehicles mounted with a same or similar battery system as the target vehicle; optimizing a BMS related algorithm for the target vehicle by performing transfer learning based on the training data, wherein the BMS related algorithm comprises one or a combination of: a battery model, parameters for the battery model, a battery management algorithm, and parameters for the battery management algorithm.

18 Claims, 2 Drawing Sheets

---

Obtaining training data, wherein the training data includes data from a target vehicle and data from auxiliary vehicles, and the auxiliary vehicles are vehicles mounted with a same or similar battery system as the target vehicle — S102

Optimizing a BMS related algorithm for the target vehicle by performing transfer learning based on the training data, wherein the BMS related algorithm includes one or a combination of: a battery model, parameters for the battery model, a battery management algorithm, and parameters for the battery management algorithm — S104

METHOD AND APPARATUS FOR OPTIMIZING BATTERY MANAGEMENT SYSTEM

TECHNICAL FIELD

The present disclosure relates to the field of battery management, in particular to a method and apparatus for optimizing a battery management system (BMS).

BACKGROUND

The principle shortcomings of the existing battery management system (BMS) for electric vehicles (e.g., battery electric vehicles (BEV), plugged in electric vehicles (PEVs), plugged in hybrid electric vehicles (PHEVs)) lie in that the BMS is designed based on the limited battery data at the beginning of life from labor-extensive and time-consuming laboratory experiments. What the battery models and battery management system algorithms still frightfully lack is the ability to generalize to conditions that are different from the ones encountered during training at the design phase. The real operational conditions are messy and contain an infinite number of novel scenarios, many of which the battery model and battery algorithms have not encountered during training and for this the battery model and battery algorithms are in turn ill-prepared to make predictions.

With consideration of the limitation of battery data, engineers heuristically and conservatively design battery management algorithms and choose corresponding control parameters based on the worst-case study so that all battery parameters are expected to limit to the safest operating range under the worst case. The battery management systems of this kind can only operate in very orchestrated and specific environment with the experimental data that exactly describes the condition that will occur in the field. These conservative and heuristic methods not only present severe limitations in system capability and create potential safety issues but also lose an opportunity to optimize the performance according to each individual PEV charging and driving patterns. As the batteries age, they have no ability to learn from the past usages and cannot adapt on-line to changes they encounter in real environments.

SUMMARY

The following presents a simplified summary in order to provide a basic understanding of some aspects of the present disclosure. This summary is not an extensive overview of the present disclosure. It is intended neither to identify key or critical element of the present disclosure. The following summary merely presents some concepts of the present disclosure in a simplified form as a prelude to the description below.

In accordance with an aspect of the present disclosure, a method for optimizing a battery management system (BMS) is provided. The method comprises: obtaining training data, wherein the training data comprises data from a target vehicle and data from auxiliary vehicles, and the auxiliary vehicles are vehicles mounted with a same or similar battery system as the target vehicle; optimizing a BMS related algorithm for the target vehicle by performing transfer learning based on the training data, wherein the BMS related algorithm comprises one or a combination of: a battery model, parameters for the battery model, a battery management algorithm, and parameters for the battery management algorithm.

In at least one exemplary embodiment, before optimizing a BMS related algorithm for the target vehicle by performing transfer learning based on the training data, further comprising: pretraining an initial BMS related algorithm based on experimental data of fresh battery cells for the target vehicle; or, establishing a basic BMS related algorithm based on experimental data of fresh battery cells for the target vehicle, and optimizing the basic BMS related algorithm based on calibration data based on test vehicles to obtain the initial BMS related algorithm, wherein the initial BMS related algorithm comprises one or a combination of: an initial battery model, parameters for the initial battery model, an initial battery management algorithm, and parameters for the initial battery management algorithm.

In at least one exemplary embodiment, before obtaining training data, the method further comprises one or a combination of: selecting the auxiliary vehicles based on similarity between the auxiliary vehicles and the target vehicle; determining weights for the auxiliary vehicles based on the similarity between the auxiliary vehicles and the target vehicle.

In at least one exemplary embodiment, the similarity between the auxiliary vehicles and the target vehicle comprises one or a combination of: the similarity in usage, the similarity in battery configuration, wherein the similarity in usage includes one or a combination of: the similarity in driving pattern and the similarity in charging pattern.

In at least one exemplary embodiment, the similarity in battery system comprises one or a combination of: the similarity in battery chemistry, the similarity in battery composition, the similarity in battery age.

In at least one exemplary embodiment, optimizing a BMS related algorithm for the target vehicle by performing transfer learning based on the training data comprises: determining a source domain based on the data from the auxiliary vehicles, and determining a target domain based on the data from the target vehicle; optimizing the BMS related algorithm for the target vehicle by performing transfer learning based on the source domain and the target domain.

In at least one exemplary embodiment, the source domain $\mathcal{D}_s = \{(v_i^s, u_i^s, d_i^s, c_i^s)\}_{i=1}^{n_s}$, wherein $v_i^s$ denotes a vehicle status of the ith auxiliary vehicle, $u_i^s$ denotes a driving behavior of the ith auxiliary vehicle, $d_i^s$ denotes a battery data of the ith auxiliary vehicle, and $c_i^s$ denotes a BMS related algorithm of the ith auxiliary vehicle, $n_s$ denotes the number of the auxiliary vehicles; the target domain $\mathcal{D}_t = \{(v^t, u^t, d^t, c^t)\}$, wherein $v^t$ denotes a vehicle status of the target vehicle, $u^t$ denotes a driving behavior of the target vehicle, $d^t$ denotes a battery data of the target vehicle, and $c^t$ denotes a BMS related algorithm of the target vehicle.

In at least one exemplary embodiment, determining a source domain based on the data from the auxiliary vehicles comprises: combining the battery data $d_i^s$ of the auxiliary vehicles based on weights for the auxiliary vehicles to obtain weighted $d^s$; determining a general BMS related algorithm $c^s$ based on the weighted $d^s$, and determining the source domain based on the general BMS related algorithm $c^s$.

In at least one exemplary embodiment, optimizing the BMS related algorithm for the target vehicle by performing transfer learning based on the source domain and the target domain comprises: tuning the general BMS related algorithm $c^s$ by using the battery data $d^t$ of the target vehicle to derive the BMS related algorithm $c^t$ of the target vehicle which satisfies a preset condition.

In at least one exemplary embodiment, the preset condition comprises one of: the BMS related algorithm $c^t$ of the target vehicle has a minimized prediction error; the BMS related algorithm $c^t$ of the target vehicle has a cross-validation accuracy above a predetermined threshold.

In at least one exemplary embodiment, when no BMS related algorithm $c^t$ of the target vehicle which satisfies the preset condition is derived, the method further comprising: performing active learning to reselect the auxiliary vehicles and/or determine weights for the auxiliary vehicles.

In at least one exemplary embodiment, after optimizing a BMS related algorithm for the target vehicle by performing transfer learning based on the training data, the method further comprises: programming the BMS related algorithm for the target vehicle to the target vehicle.

In accordance with another exemplary embodiment of the present disclosure, an apparatus for optimizing a battery management system (BMS) is provided. The apparatus includes a hardware processor and a memory, wherein the hardware processor is configured to execute program instructions stored in the memory to: obtain training data, wherein the training data includes data from a target vehicle and data from auxiliary vehicles, and the auxiliary vehicles are vehicles mounted with a same or similar battery system as the target vehicle; and optimize a BMS related algorithm for the target vehicle by performing transfer learning based on the training data, wherein the BMS related algorithm includes one or a combination of: a battery model, parameters for the battery model, a battery management algorithm, and parameters for the battery management algorithm.

In at least one exemplary embodiment, the apparatus is a cloud server or cloud platform or is located inside a cloud server or cloud platform.

In at least one exemplary embodiment, the hardware processor is further configured to execute program instructions stored in the memory to: pretrain an initial BMS related algorithm based on experimental data of fresh battery cells for the target vehicle; or, establish a basic BMS related algorithm based on experimental data of fresh battery cells for the target vehicle, and optimizing the basic BMS related algorithm based on calibration data based on test vehicles to obtain the initial BMS related algorithm, wherein the initial BMS related algorithm includes one or a combination of: an initial battery model, parameters for the initial battery model, an initial battery management algorithm, and parameters for the initial battery management algorithm.

In at least one exemplary embodiment, the hardware processor is further configured to execute program instructions stored in the memory to perform one or a combination of: selecting the auxiliary vehicles based on similarity between the auxiliary vehicles and the target vehicle; determining weights for the auxiliary vehicles based on the similarity between the auxiliary vehicles and the target vehicle.

In at least one exemplary embodiment, the similarity between the auxiliary vehicles and the target vehicle includes one or a combination of: the similarity in usage, the similarity in battery configuration, wherein the similarity in usage includes one or a combination of: the similarity in driving pattern and the similarity in charging pattern.

In at least one exemplary embodiment, the hardware processor is configured to execute program instructions stored in the memory to: determine a source domain based on the data from the auxiliary vehicles, and determining a target domain based on the data from the target vehicle; and optimize the BMS related algorithm for the target vehicle by performing transfer learning based on the source domain and the target domain.

In at least one exemplary embodiment, the hardware processor is further configured to execute program instructions stored in the memory to: program the BMS related algorithm for the target vehicle to the target vehicle.

In accordance with still another exemplary embodiment of the present disclosure, a non-transitory computer readable storage medium is provided. The non-transitory computer readable storage medium includes program codes which, when executed by a computing device, cause the computing device to: obtain training data, wherein the training data includes data from a target vehicle and data from auxiliary vehicles, and the auxiliary vehicles are vehicles mounted with a same or similar battery system as the target vehicle; and optimize a BMS related algorithm for the target vehicle by performing transfer learning based on the training data, wherein the BMS related algorithm includes one or a combination of: a battery model, parameters for the battery model, a battery management algorithm, and parameters for the battery management algorithm.

BRIEF DESCRIPTION OF THE DRAWINGS

The accompanying drawings described here are used for providing a deeper understanding of the present invention, and constitute a part of the application; schematic embodiments of the present invention and description thereof are used for illustrating the present invention and not intended to form an improper limit to the present invention. In the accompanying drawings.

DETAILED DESCRIPTION OF THE EMBODIMENTS

Figure 1:
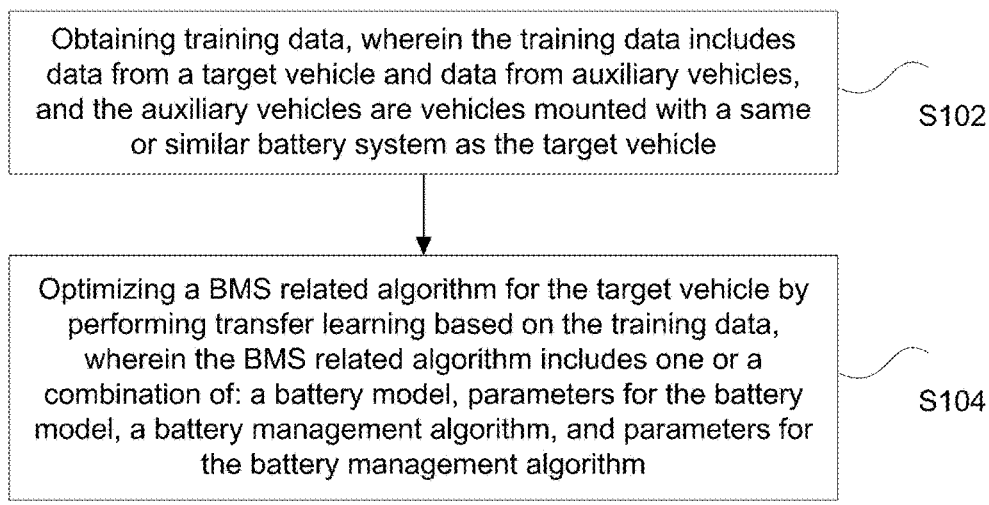
FIG. 1 is a flow chart of a method for optimizing a battery management system according to an embodiment of the present disclosure.

For electric vehicles (e.g., battery electric vehicles (BEV), plugged in electric vehicles (PEVs), plugged in hybrid electric vehicles (PHEVs)), a battery management system (BMS) controls the use of batteries and is one of the core control systems used by electric vehicles. The design for BMS algorithms generally requires laboratory test data for batteries and calibration data obtained via a large number of vehicle running processes. The laboratory test data of the batteries is generally used as a basis for establishing the BMS algorithm, and after a basic algorithm model is established, model parameters are adjusted and optimized by test and calibration performed on real vehicles.

In order to obtain model parameters with high control accuracy and adaptive to a corresponding type of vehicle, a common method is to apply the battery on a test vehicle of a corresponding type, and to test and calibrate relevant working conditions before sale of the vehicle of this type. However, this method has several problems. On the one hand, in the development process of a type of vehicle, mounting batteries onto the vehicles and calibrating and testing the batteries take a relatively long time and require a high cost, which greatly affect the development cycle and cost management and control. On the other hand, when the BMS algorithm is designed based on the test condition, since there is a difference between actual working conditions and test conditions and the driving habits of the actual drivers may also be different from those of the testers, the algorithm calibration parameters may not be well adapted to the requirements of the actual users.

It can be concluded from the above analysis that data shortage is a key problem during the BMS algorithm design. A method for solving the data shortage problem during BMS algorithm design by using transfer learning is mainly proposed in the embodiments of the present disclosure. The method utilizes actual working data of a type of vehicle in which the batteries are applied and the working data of other types of vehicles in which the batteries are applied to perform transfer learning optimization on the BMS algorithm, which reduces the need for calibration data of a sample vehicle when the BMS algorithm is designed, reduces the cycle and cost of development of vehicles, and better adapts the BMS algorithm to the usage habits of actual users of the vehicle. Instead of design of the battery management system based on the laboratory data, as is currently done, the fundamentally new adaptive transfer learning battery management design methodology requires only limited battery data at the beginning of life and uses cloud computing and connected vehicle technology to enable battery management systems to apply previously learned information to novel situations. Such a battery management system is safer, more functional, and adapting quickly to unforeseen circumstances, ensuring an optimal operation of the battery system to guarantee for durability and reliability through a system's field lifetime experience, and personalizing the individual PEV experience according to each PEV charging and driving patterns as well as road and environmental conditions while ensuring battery life.

In order to make those skilled in the art understand the solutions of the present invention more clearly, the technical solutions in the embodiments of the present invention are clearly and completely elaborated below in combination with the accompanying drawings. It is apparent that the described embodiments are only a part of the embodiments of the present invention but not all. Based on the embodiments of the present invention, all the other embodiments obtained by those of ordinary skill in the art on the premise of not contributing creative effort belong to the scope of protection of the present invention.

It is to be noted that the terms like "first" and "second" in the specification, the claims and the accompanying drawings of the present invention are used for differentiating the similar objects, but do not have to describe a specific order or a sequence. It should be understood that the objects may be exchanged under appropriate circumstances, so that the embodiments of the present invention described here may be implemented in an order different from that described or shown here. Moreover, the terms like "include" and "have" and any variation of them are intended to cover nonexclusive including; for example, the process, method, system, product or device including a series of steps or units do not have to be limited to those clearly listed steps or units, but may include other steps or units which are not clearly listed or inherent in these process, method, system, product or device.

In accordance with an embodiment of the present disclosure, a method for optimizing a battery management system (BMS) is provided. The method may be executed by any device having a computing capability, for example, a cloud server, a cloud platform, an on-vehicle processing device, etc. Since the process in the method for optimizing the BMS requires relatively large computing capability and resources, it is suggested to execute the method by a cloud server or platform. FIG. 1 shows a flow chart of a method for optimizing a battery management system according to an embodiment of the present disclosure. As shown in FIG. 1, the method for optimizing the battery management system includes the following operations S102 and S104.

In operation S102, training data is obtained, wherein the training data includes data from a target vehicle and data from auxiliary vehicles, and the auxiliary vehicles are vehicles mounted with a same or similar battery system as the target vehicle. In at least one exemplary embodiment, the training data may be obtained by receiving the data reported (e.g., real-timely uploaded) by the target vehicle or the auxiliary vehicles.

In operation S104, a BMS related algorithm for the target vehicle is optimized by performing transfer learning based on the training data, wherein the BMS related algorithm includes one or a combination of: a battery model, parameters for the battery model, a battery management algorithm, and parameters for the battery management algorithm.

In at least one exemplary embodiment, before the operation S104, the method may further include: pretraining an initial BMS related algorithm based on experimental data of fresh battery cells for the target vehicle; or, establishing a basic BMS related algorithm based on experimental data of fresh battery cells for the target vehicle, and optimizing the basic BMS related algorithm based on calibration data based on test vehicles to obtain the initial BMS related algorithm, wherein the initial BMS related algorithm includes one or a combination of: an initial battery model, parameters for the initial battery model, an initial battery management algorithm, and parameters for the initial battery management algorithm.

In at least one exemplary embodiment, before the operation S102, the method may further include one or a combination of: selecting the auxiliary vehicles based on similarity between the auxiliary vehicles and the target vehicle; determining weights for the auxiliary vehicles based on the similarity between the auxiliary vehicles and the target vehicle.

In at least one exemplary embodiment, the similarity between the auxiliary vehicles and the target vehicle may include one or a combination of: the similarity in usage, the similarity in battery configuration, wherein the similarity in usage includes one or a combination of: the similarity in driving pattern and the similarity in charging pattern.

In at least one exemplary embodiment, the similarity in battery system may include one or a combination of: the similarity in battery chemistry, the similarity in battery composition, the similarity in battery age. Herein, the similarity in battery composition includes one or a combination of: the number of battery cells connected in series or in parallel, and a cell capacity In at least one exemplary embodiment, the operation S104 may include: determining a source domain based on the data from the auxiliary vehicles, and determining a target domain based on the data from the target vehicle; optimizing the BMS related algorithm for the target vehicle by performing transfer learning based on the source domain and the target domain.

In at least one exemplary embodiment, the source domain $\mathcal{D}_s = \{(v_i^s, u_i^s, d_i^s, c_i^s)\}_{i=1}^{n_s}$, wherein $v_{si}^s$ denotes a vehicle status of the ith auxiliary vehicle, $u_i^s$ denotes a driving behavior of the ith auxiliary vehicle, $d_i^s$ denotes a battery data of the ith auxiliary vehicle, and $c_i^s$ denotes a BMS related algorithm of the ith auxiliary vehicle, $n_s$ denotes the number of the auxiliary vehicles; the target domain $\mathcal{D}_t = \{(v^t, u^t, d^t, c^t)\}$, wherein $v^t$ denotes a vehicle status of the target vehicle, $u^t$ denotes a driving behavior of the target vehicle, $d^t$ denotes a battery data of the target vehicle, and $c^t$ denotes a BMS related algorithm of the target vehicle.

In at least one exemplary embodiment, determining a source domain based on the data from the auxiliary vehicles includes: combining the battery data $d_i^s$ of the auxiliary vehicles based on weights for the auxiliary vehicles to obtain weighted $d^s$; determining a general BMS related algorithm $c^s$ based on the weighted $d^s$, and determining the source domain based on the general BMS related algorithm $c^s$.

In at least one exemplary embodiment, optimizing the BMS related algorithm for the target vehicle by performing transfer learning based on the source domain and the target domain includes: tuning the general BMS related algorithm $c^s$ by using the battery data $d^t$ of the target vehicle to derive the BMS related algorithm $c^t$ of the target vehicle which satisfies a preset condition.

In at least one exemplary embodiment, the preset condition includes one of: the BMS related algorithm $c^t$ of the target vehicle has a minimized prediction error; the BMS related algorithm $c^t$ of the target vehicle has a cross-validation accuracy above a predetermined threshold.

In at least one exemplary embodiment, when no BMS related algorithm $c^t$ of the target vehicle which satisfies the preset condition is derived, the method further including: performing active learning to reselect the auxiliary vehicles and/or determine weights for the auxiliary vehicles.

In at least one exemplary embodiment, after the operation S104, the method may further include: programming the BMS related algorithm for the target vehicle to the target vehicle.

It is to be noted that for the sake of simple description, each aforementioned embodiment of the method is described as a series of action combinations. But those skilled in the art should know that the present invention is not limited to a sequence of the described actions, it is because some steps may be performed in other sequences or simultaneously according to the present invention. Besides, those skilled in the art should also know that all the embodiments described in the specification are preferred embodiments, and the actions and modules involved may not be necessary.

Figure 2:
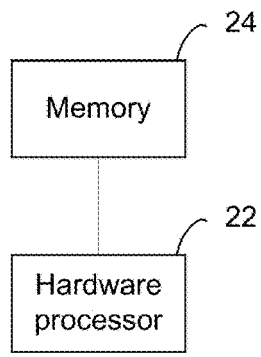
FIG. 2 is a schematic diagram showing the structure of an apparatus for optimizing a battery management system according to an embodiment of the present disclosure.

In accordance with another exemplary embodiment of the present disclosure, an apparatus for optimizing a battery management system (BMS) is provided. FIG. 2 is a schematic diagram showing the structure of an apparatus for optimizing a battery management system according to an embodiment of the present disclosure. As shown in FIG. 2, the apparatus includes a hardware processor 22 and a memory 24, wherein the hardware processor 22 is configured to execute program instructions stored in the memory 24 to perform the method described in the previous embodiment and exemplary embodiments.

In at least one exemplary embodiment, the apparatus may be a cloud server or cloud platform or may be located inside a cloud server or cloud platform.

In at least one exemplary embodiment, the hardware processor is further configured to execute program instructions stored in the memory to: pretrain an initial BMS related algorithm based on experimental data of fresh battery cells for the target vehicle; or, establish a basic BMS related algorithm based on experimental data of fresh battery cells for the target vehicle, and optimizing the basic BMS related algorithm based on calibration data based on test vehicles to obtain the initial BMS related algorithm, wherein the initial BMS related algorithm includes one or a combination of: an initial battery model, parameters for the initial battery model, an initial battery management algorithm, and parameters for the initial battery management algorithm.

In at least one exemplary embodiment, the hardware processor is further configured to execute program instructions stored in the memory to perform one or a combination of: selecting the auxiliary vehicles based on similarity between the auxiliary vehicles and the target vehicle; determining weights for the auxiliary vehicles based on the similarity between the auxiliary vehicles and the target vehicle.

In at least one exemplary embodiment, the similarity between the auxiliary vehicles and the target vehicle includes one or a combination of: the similarity in usage, the similarity in battery configuration, wherein the similarity in usage includes one or a combination of: the similarity in driving pattern and the similarity in charging pattern.

In at least one exemplary embodiment, the hardware processor is configured to execute program instructions stored in the memory to: determine a source domain based on the data from the auxiliary vehicles, and determining a target domain based on the data from the target vehicle; and optimize the BMS related algorithm for the target vehicle by performing transfer learning based on the source domain and the target domain.

In at least one exemplary embodiment, the hardware processor is further configured to execute program instructions stored in the memory to: program the BMS related algorithm for the target vehicle to the target vehicle.

Other aspects of the apparatus for improving a battery management system can be obtained based on description in the previous embodiments, and thus will not be repeated herein.

In accordance with still another exemplary embodiment of the present disclosure, a non-transitory computer readable storage medium is provided. The non-transitory computer readable storage medium includes program codes which, when executed by a computing device, cause the computing device to: obtain training data, wherein the training data includes data from a target vehicle and data from auxiliary vehicles, and the auxiliary vehicles are vehicles mounted with a same or similar battery system as the target vehicle; and optimize a BMS related algorithm for the target vehicle by performing transfer learning based on the training data, wherein the BMS related algorithm includes one or a combination of: a battery model, parameters for the battery model, a battery management algorithm, and parameters for the battery management algorithm.

In accordance with still another embodiment of the present disclosure, a detailed method for optimizing a battery management system (BMS) is described to facilitate the understanding of the method of the embodiments of the present disclosure.

Problem Formulation:

Battery management methodology can be considered as a transfer learning problem. Given a set of auxiliary vehicles from source domain $\mathcal{D} = \{(v_i^s, u_i^s, d_i^s, c_i^s)\}_{i=1}^{n_s}$, where $v_i^s$, $u_i^s$, $d_i^s$ and, $c_i^s$ denotes vehicle status, driving behavior, battery data, and the control algorithms or battery models of the ith vehicle, respectively, and a target vehicle from target domain $\mathcal{D}_t=\{(v^t, u^t, d^t, c^t)\}$, the goal is to learn a predictive model using all the data from the source domain to minimize the squared prediction error of the battery model and battery management algorithms, $\Sigma_{i=1}^{m}(\hat{c}_i^t-c_i^t)^2$ where $\hat{c}_i^t$ and $c_i^t$ are the predicted and the actual true values of the battery model and battery management algorithms by actively choosing the test points.

Traditional battery model and battery management algorithms intend to use the classic supervised learning to train a model and battery management algorithms with laboratory data. According to the approach proposed in the present embodiment, active transfer learning is used to train a model on data from auxiliary vehicles on the market and expect it to perform well on unseen data of the target vehicles and drivers. Besides the optimized models, algorithms, and their corresponding parameters, this approach also offloads all learning algorithm from the vehicles to the cloud to reduce the computation and memory requirements for the BMS. It also enables advanced transfer learning on the cloud to optimize performances of vehicles and their components. In the embodiments of the present disclosure, an initial model is developed from the lab or test data, an active model is used to select data for updating the model and algorithm, and transfer learning is used to transfer model from one vehicle to another one.

In order to achieve this goal, an adaptive transfer learning architecture proposed is described in detail as follows.

Figure 3:
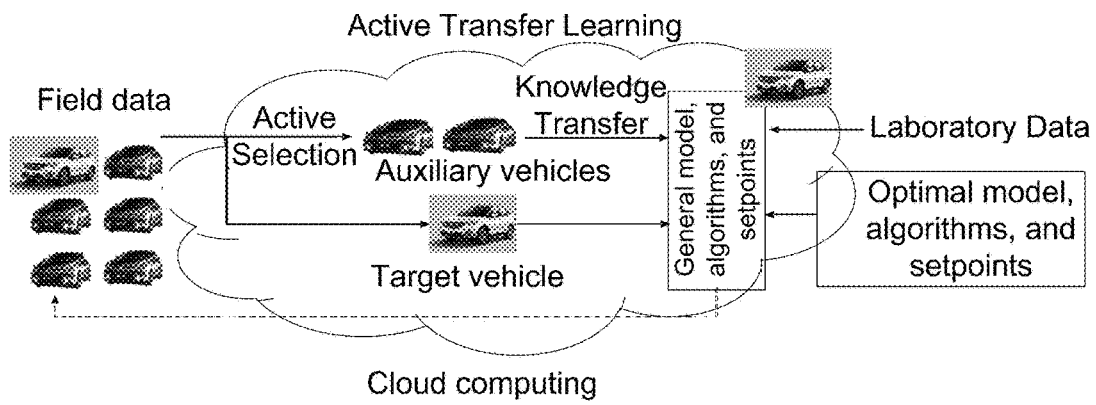
FIG. 3 is a schematic diagram showing the architecture for the adaptive transfer learning approach to optimal and personalized BMS according to an embodiment of the present disclosure.

To enable battery management systems to apply previously learned information to novel situations, an adaptive transfer learning approach as shown in the FIG. 3 is proposed in the embodiment. FIG. 3 is a schematic diagram showing the architecture for the adaptive transfer learning approach to optimal and personalized BMS according to the embodiment of the present disclosure. In the proposed adaptive transfer learning approach, active learning optimally selects the most informative auxiliary vehicles, and transfer learning makes use of training data from other auxiliary vehicles to derive battery model and algorithms. The adaptive transfer learning approach is specifically described in detail as below.

In the PEV development stage, an initial battery model, algorithms, and their parameters are developed based on the very limited battery data in laboratory and integrated into the battery management system for each new vehicle. As the vehicles operate in the field, the transfer learning algorithm in the cloud will create an adaptive battery model, adaptive algorithms, and their corresponding parameters according to the field data. The created adaptive battery model, algorithms, and their corresponding parameters will be programmed to each vehicle through the over-the-air programming. Although all PEVs real-timely upload their data to the cloud, it is expensive, exhaustive, and unnecessary to use data from all PEVs to derive the adaptive model, adaptive algorithms, and their corresponding parameters because not all vehicles share the similar driving and charging patterns. We adopt active learning to select the informative auxiliary vehicles. The auxiliary vehicles contain the similar driving and charging patterns and thus we use transfer learning to transfer knowledge from the informative data of auxiliary vehicles to the target vehicle. Since the auxiliary vehicles are only a small portion of all PEVs, the active transfer learning will significantly reduce the data size to improve the transfer efficiency while achieving satisfactory performance. The transfer learning algorithm will use transferred knowledge from auxiliary vehicles and the target vehicles to optimize battery model, algorithms, and their parameters. To personalize the vehicles performance, the knowledge from the auxiliary vehicles is weighted according to the target vehicle.

Transfer Learning:

Different types of vehicles use different types of battery configurations and even different battery chemistries. Each vehicle may also have different ages and charging and driving profiles. Transfer learning aims at boosting the learning process of updating battery model and battery management algorithms for different behaviors by transferring knowledge from an old battery to a new battery, from one battery chemistry to another one, or different driving profiles. Given auxiliary and target vehicles, source and target domains, source and target tasks, and source and target conditions can vary in four ways, which we will illustrate in the following.

$v^s \neq v^t$. The feature spaces of the source and target domain are different. The vehicle can be different types such as EV, HEV, and PHEV. Each type of vehicle may own different types of batteries with unique battery chemistry and size. Each battery may have unique battery life.

$u^s \neq u^t$. How the drivers use these vehicles of source and target domains are different. The driver behaviors are different. Each vehicle may also operate at different locations.

$d^s \neq d^t$. The battery data are different because each driver has a unique driver profile, and the vehicle may also have difference features.

$c^s \neq c^t$. The battery models and battery management algorithms to manage the battery behaviors are different due to different battery ages and chemistries.

Figure 4:
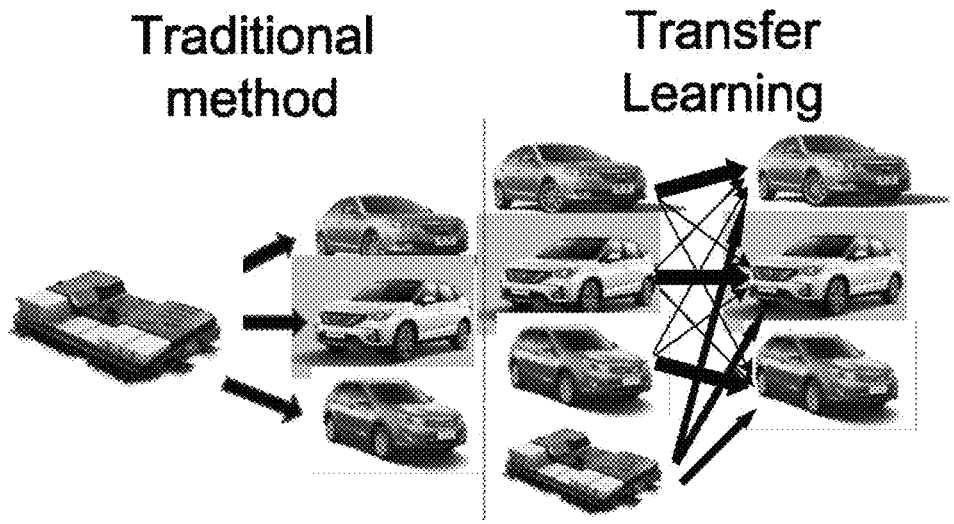
FIG. 4 is a schematic diagram for transfer learning according to an embodiment of the present disclosure.

There are many different transfer learning algorithms. FIG. 4 is a schematic diagram for transfer learning according to the embodiment of the present disclosure. In FIG. 4, the size of line indicates the weights of transferred knowledge. For each target vehicle, we combine data from auxiliary vehicles for building battery model and battery management algorithms, where the contribution of the data from an auxiliary subject is determined by the response similarity between an auxiliary vehicle and the target vehicles. The detailed implementation of the transfer learning algorithm is provided as follows.

Input for the transfer learning algorithm includes:
features of auxiliary vehicles $v_s$ and the target vehicle $v_t$ such as vehicle parameters, battery parameters, battery chemistry, and age;
driver driving profiles $u_s$ and $u_t$ such as acceleration, average speed, locations, and charging preference;
battery data of auxiliary vehicles $d_s$ and the target vehicle $d_t$;
experimental data of fresh cells $d_e$;
the number of auxiliary vehicles $N_s$.

Output for the transfer learning algorithm includes:
battery model and battery management algorithms.

Pretrain a battery model and battery management algorithms based on the experimental data of fresh cells. This is the starting point of the model and algorithms. The active learning and transfer learning will twist the model based on the new data.

For m in [1, M] do:
Combine battery data of $d_t$ and $d_s$ from the target vehicle and $N_s$ auxiliary vehicles to update battery model and battery management algorithms.

Use weighted $d_s$ to find the general battery model architecture, battery management algorithms, and corresponding parameters, $c_s$.

Use battery data $d_t$ from $v_t$ to tune the battery model and battery management algorithms $c_s$ for deriving $c_t$ and record the best cross-validation accuracy $\Sigma_{i=1}^{m}(\hat{c}_i^t - c_i^t)^2$.
  end
Return Weight of $d_5$ and $c_t$ By virtue of the above transfer learning algorithm, we can transfer the learned experience from auxiliary vehicles into target vehicles. The transfer learning uses data from auxiliary data to derive a general battery model architecture and initial parameters as well as battery management algorithms. After the target vehicles got this battery model architecture and initial parameters as well as battery management algorithms, it will refine the parameters and setpoints of the battery management algorithms to personalize them. Specifically, the battery model and battery management algorithms are firstly developed based on the experimental data, and then the battery model and battery management algorithms are trained by data from auxiliary vehicles and the target vehicle. The final battery model and battery management algorithm are a weighted voting from all the battery model and battery management algorithms. Herein, weighted voting can be the same or assigned based on the importance of the information.

In accordance with still another embodiment of the present disclosure, a detailed method for optimizing a battery management system (BMS) is described to facilitate the understanding of the method of the embodiments of the present disclosure.

The BMS algorithm design method generally requires laboratory test data for cells and calibration data based on a large number of vehicle travel processes. The laboratory test data of the battery is generally used as a basis for establishing an algorithm, and after establishing a basic algorithm model, the model parameters are optimized through test calibration on an actual vehicle. In order to obtain a model parameter with high control accuracy and adaptive to a corresponding vehicle model, a common method is to mount a test vehicle of a corresponding vehicle model, and to test and calibrate relevant working conditions before sale of the vehicle. However, there are several problems with this method. A main problem is data shortage, for example, there is not enough field data such as working conditions, driving behavior and environment, and there is also not enough field data for the vehicle since as a new vehicle there is not so much actual field data. Through transfer learning, the data shortage problem for a new vehicle can be addressed.

The method for optimizing the battery management system generally includes the following four steps:
1. Firstly using laboratory data to build a basic BMS algorithm model;
2. Preliminarily optimizing the model with a small amount of calibration data under different working conditions of a test vehicle;
3. Performing a BMS algorithm transfer learning optimization for a vehicle's entire lifecycle using field data such as a working condition, a driving behavior, and an environment obtained during actual driving process. The step 3 optimizes the BMS by actual working data of the actual vehicle, so that the working performance of the battery system and the driving experience can be improved.
4. Performing inter-vehicle transfer learning optimization on the BMS algorithm of the vehicle using field data such as a working condition, a driving behavior, and an environment obtained during the driving process of auxiliary vehicles mounted with the same (or similar) battery system. In step 4, the BMS algorithm is sufficiently and cooperatively optimized by using cloud computing based on field data and control strategy parameters during running of auxiliary vehicles mounted with the same battery of the target vehicle. Not only the accuracy of the control by the BMS algorithm is improved, but also the computing amount required by the design of the control algorithm is reduced. In addition, the optimized BMS algorithm may be fed back into the input source data to form a closed loop (input-output-input), so that iteration and optimization can be continuously performed.

In the method, the data involved in the BMS algorithm design mainly includes data of four aspects:
(1) Laboratory test data of the cell. The laboratory test data refers to basic performance data, such as the capacity, internal resistance, power, open circuit voltage curves of the battery cells that can be measured in the laboratory.
(2) Calibration data based on test vehicle. Calibration data based on the test vehicle refers to voltage, current, power, etc. of a battery system obtained by testing battery cells mounted on a test vehicle.
(3) Actual field data of the vehicle. Actual field data of the vehicle include field data such as an operating condition, a driving behavior, and an environment.
(4) Actual working data of auxiliary vehicles mounted with the same battery. BMS algorithm parameters and actual field data of other vehicles mounted with the same battery include field data such as operating conditions, driving behavior and environment.

Figure 5:
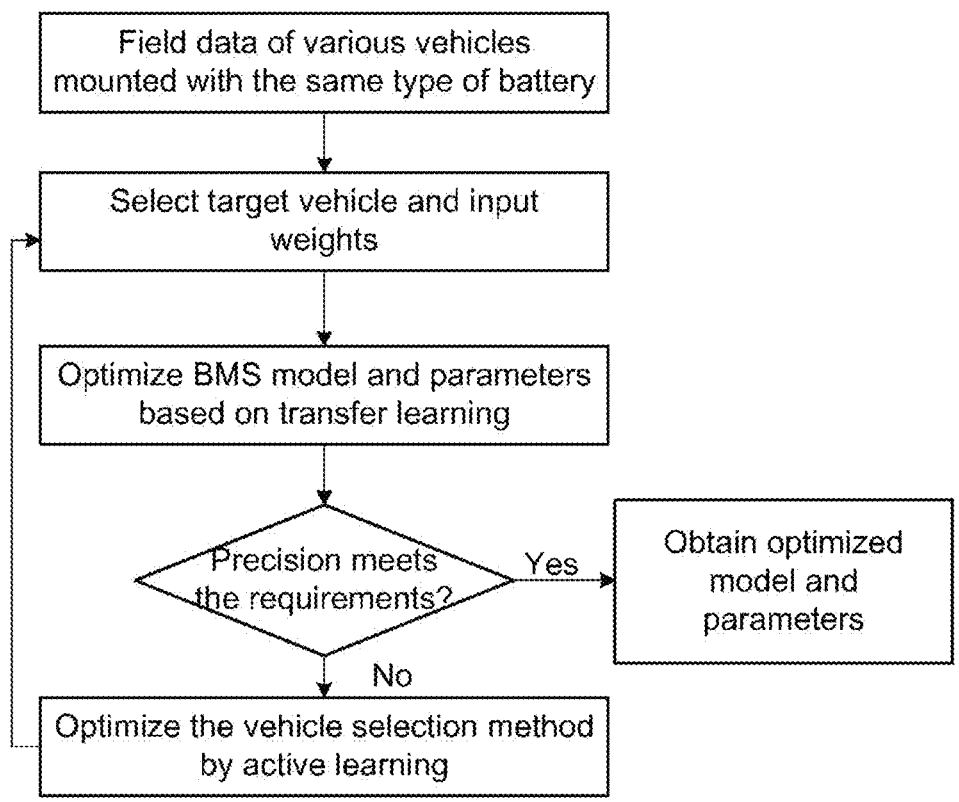
FIG. 5 is a flowchart of the method for optimizing the BMS algorithm in the steps 3-4 according to an embodiment of the present disclosure.

FIG. 5 is a flowchart of the method for optimizing the BMS algorithm in the steps 3-4 according to an embodiment of the present disclosure. Firstly, auxiliary vehicles are selected from field data of various vehicles mounted with the battery and the proportional weights are input for each selected vehicle, and this step can be implemented according to the degree of similarity of the battery systems of different vehicles in the following aspects: the chemical system of the battery cells, the number of battery cells connected in series or parallel, the age of the battery cells, etc. Subsequently, the BMS model and parameters (including parameters such as battery charge state, open circuit voltage, internal resistance, terminal voltage, capacitance, etc.) are optimized using the transfer learning method based on the field data of the selected vehicles. When the model accuracy satisfies the requirement, the iteration is stopped; otherwise, the vehicle selection method is optimized by using the active learning method, and the transfer learning optimization of the model is resumed after a new set of auxiliary vehicles is selected.

By virtue of the solution of the embodiments of the present disclosure, transfer learning of different life cycles of the same type of vehicle is conducted, i.e., the BMS algorithm is optimized based on real-time data in an entire life cycle of the vehicle, thereby solving the problem of shortage of test calibration data. In addition, transfer learning between different vehicles is achieved, i.e., transfer optimization is performed on the BMS algorithm by using the field data of auxiliary vehicles mounted with the same battery system, thereby solving the problem that actual field data of the battery system cannot be obtained since there is no real vehicle to mount the battery system.

The above is only the preferred embodiments of the present invention; it should be indicated that, on the premise of not departing from the principles of the present invention, those of ordinary skill in the art may also make a number of improvements and supplements, and these improvements and supplements should fall within the scope of protection of the present invention.

What is claimed is:

1. A method for optimizing a battery management system (BMS), comprising:
   obtaining training data, wherein the training data comprises data from a target vehicle and data from auxiliary vehicles, and the auxiliary vehicles are vehicles mounted with a same or similar battery system as the target vehicle; and
   optimizing a BMS related algorithm for the target vehicle by performing transfer learning based on the training data, wherein the BMS related algorithm comprises one or a combination of: a battery model, parameters for the battery model, a battery management algorithm, and parameters for the battery management algorithm;
   wherein before optimizing the BMS related algorithm for the target vehicle by performing transfer learning based on the training data, the method further comprises:
   pretraining an initial BMS related algorithm based on experimental data of fresh battery cells for the target vehicle; or,
   establishing a basic BMS related algorithm based on the experimental data of the fresh battery cells for the target vehicle, and optimizing the basic BMS related algorithm based on calibration data based on test vehicles to obtain the initial BMS related algorithm, the initial BMS related algorithm comprising one or a combination of: an initial battery model, parameters for the initial battery model, an initial battery management algorithm, and parameters for the initial battery management algorithm.

2. The method as claimed in claim 1, before obtaining training data, further comprising one or a combination of:
   selecting the auxiliary vehicles based on similarity between the auxiliary vehicles and the target vehicle;
   determining weights for the auxiliary vehicles based on the similarity between the auxiliary vehicles and the target vehicle.

3. The method as claimed in claim 2, wherein the similarity between the auxiliary vehicles and the target vehicle comprises one or a combination of: the similarity in usage, the similarity in battery configuration, wherein the similarity in usage comprises one or a combination of: the similarity in driving pattern and the similarity in charging pattern.

4. The method as claimed in claim 3, wherein the similarity in battery system comprises one or a combination of: the similarity in battery chemistry, the similarity in battery composition, the similarity in battery age.

5. The method as claimed in claim 1, wherein optimizing a BMS related algorithm for the target vehicle by performing transfer learning based on the training data comprises:
   determining a source domain based on the data from the auxiliary vehicles, and determining a target domain based on the data from the target vehicle; and
   optimizing the BMS related algorithm for the target vehicle by performing transfer learning based on the source domain and the target domain.

6. The method as claimed in claim 5, wherein
   the source domain $\mathcal{D}_s = \{(v_i^s, u_i^s, d_i^s, c_i^s)\}_{i=1}^{n_s}$, wherein $v_i^s$ denotes a vehicle status of the ith auxiliary vehicle, $u_i^s$ denotes a driving behavior of the ith auxiliary vehicle, $d_i^s$ denotes a battery data of the ith auxiliary vehicle, and $c_i^s$ denotes a BMS related algorithm of the ith auxiliary vehicle, $n_s$ denotes the number of the auxiliary vehicles;
   the target domain $\mathcal{D}_t = \{(v^t, u^t, d^t, c^t)\}$, wherein $v^t$ denotes a vehicle status of the target vehicle, $u^t$ denotes a driving behavior of the target vehicle, $d^t$ denotes a battery data of the target vehicle, and $c^t$ denotes a BMS related algorithm of the target vehicle.

7. The method as claimed in claim 6, wherein determining a source domain based on the data from the auxiliary vehicles comprises:
   combining the battery data $d_i^s$ of the auxiliary vehicles based on weights for the auxiliary vehicles to obtain weighted $d^s$;
   determining a general BMS related algorithm $c^s$ based on the weighted $d^s$, and determining the source domain based on the general BMS related algorithm $c^s$.

8. The method as claimed in claim 7, wherein optimizing the BMS related algorithm for the target vehicle by performing transfer learning based on the source domain and the target domain comprises:
   tuning the general BMS related algorithm $c^s$ by using the battery data $d^t$ of the target vehicle to derive the BMS related algorithm $c^t$ of the target vehicle which satisfies a preset condition.

9. The method as claimed in claim 8, wherein the preset condition comprises one of:
   the BMS related algorithm $c^t$ of the target vehicle has a minimized prediction error;
   the BMS related algorithm $c^t$ of the target vehicle has a cross-validation accuracy above a predetermined threshold.

10. The method as claimed in claim 8, wherein when no BMS related algorithm $c^t$ of the target vehicle which satisfies the preset condition is derived, the method further comprising:
    performing active learning to reselect the auxiliary vehicles and/or determine weights for the auxiliary vehicles.

11. The method as claimed in claim 1, wherein after optimizing a BMS related algorithm for the target vehicle by performing transfer learning based on the training data, the method further comprising:
    programming the BMS related algorithm for the target vehicle to the target vehicle.

12. An apparatus for optimizing a battery management system (BMS), comprising a hardware processor and a memory, wherein the hardware processor is configured to execute program instructions stored in the memory to:
    obtain training data, wherein the training data comprises data from a target vehicle and data from auxiliary vehicles, and the auxiliary vehicles are vehicles mounted with a same or similar battery system as the target vehicle; and
    optimize a BMS related algorithm for the target vehicle by performing transfer learning based on the training data, wherein the BMS related algorithm comprises one or a combination of:
    a battery model, parameters for the battery model, a battery management algorithm, and parameters for the battery management algorithm;
    wherein the hardware processor is further configured to execute program instructions stored in the memory to:
    pretrain an initial BMS related algorithm based on experimental data of fresh battery cells for the target vehicle; or,
    establish a basic BMS related algorithm based on the experimental data of the fresh battery cells for the target vehicle, and optimizing the basic BMS related algorithm based on calibration data based on test vehicles to obtain the initial BMS related algorithm, the initial BMS related algorithm comprising one or a combination of: an initial battery model, parameters for the initial battery model, an initial battery management algorithm, and parameters for the initial battery management algorithm.

13. The apparatus as claimed in claim 12, wherein the apparatus is a cloud server or cloud platform or is located inside a cloud server or cloud platform.

14. The apparatus as claimed in claim 12, wherein the hardware processor is further configured to execute program instructions stored in the memory to perform one or a combination of:
  selecting the auxiliary vehicles based on similarity between the auxiliary vehicles and the target vehicle;
  determining weights for the auxiliary vehicles based on the similarity between the auxiliary vehicles and the target vehicle.

15. The apparatus as claimed in claim 14, wherein the similarity between the auxiliary vehicles and the target vehicle comprises one or a combination of: the similarity in usage, the similarity in battery configuration, wherein the similarity in usage comprises one or a combination of: the similarity in driving pattern and the similarity in charging pattern.

16. The apparatus as claimed in claim 12, wherein the hardware processor is configured to execute program instructions stored in the memory to:
  determine a source domain based on the data from the auxiliary vehicles, and determining a target domain based on the data from the target vehicle; and
  optimize the BMS related algorithm for the target vehicle by performing transfer learning based on the source domain and the target domain.

17. The apparatus as claimed in claim 12, wherein the hardware processor is further configured to execute program instructions stored in the memory to:
  program the BMS related algorithm for the target vehicle to the target vehicle.

18. A non-transitory computer readable storage medium, comprising program codes which, when executed by a computing device, cause the computing device to:
  obtain training data, wherein the training data comprises data from a target vehicle and data from auxiliary vehicles, and the auxiliary vehicles are vehicles mounted with a same or similar battery system as the target vehicle; and
  optimize a BMS related algorithm for the target vehicle by performing transfer learning based on the training data, wherein the BMS related algorithm comprises one or a combination of: a battery model, parameters for the battery model, a battery management algorithm, and parameters for the battery management algorithm;
  wherein the computing device is further caused to:
  pretrain an initial BMS related algorithm based on experimental data of fresh battery cells for the target vehicle; or,
  establish a basic BMS related algorithm based on the experimental data of the fresh battery cells for the target vehicle, and optimizing the basic BMS related algorithm based on calibration data based on test vehicles to obtain the initial BMS related algorithm, the initial BMS related algorithm comprising one or a combination of: an initial battery model, parameters for the initial battery model, an initial battery management algorithm, and parameters for the initial battery management algorithm.

* * * * *